(12) United States Patent
Szajnowski

(10) Patent No.: US 8,575,913 B2
(45) Date of Patent: Nov. 5, 2013

(54) PULSE ANALYZER

(75) Inventor: Wieslaw Jerzy Szajnowski, Guildford (GB)

(73) Assignee: Mitsubishi Electric R&D Centre Europe, B.V., Surrey (GB)

( * ) Notice: Subject to any disclaimer, the term of this patent is extended or adjusted under 35 U.S.C. 154(b) by 529 days.

(21) Appl. No.: 12/677,744

(22) PCT Filed: Sep. 12, 2008

(86) PCT No.: PCT/GB2008/003095
§ 371 (c)(1),
(2), (4) Date: Aug. 6, 2010

(87) PCT Pub. No.: WO2009/034337
PCT Pub. Date: Mar. 19, 2009

(65) Prior Publication Data
US 2010/0295532 A1    Nov. 25, 2010

(30) Foreign Application Priority Data

Sep. 12, 2007 (GB) .................................. 0717800.7

(51) Int. Cl.
*G01R 13/34* (2006.01)
(52) U.S. Cl.
USPC ...................................................... 324/76.38
(58) Field of Classification Search
None
See application file for complete search history.

(56) References Cited

U.S. PATENT DOCUMENTS

| | | | |
|---|---|---|---|
| 4,633,171 A | 12/1986 | Storck et al. | |
| 4,729,113 A | 3/1988 | Boutigny | |
| RE37,561 E | 2/2002 | Li | |
| 6,400,129 B1 * | 6/2002 | Yamaguchi et al. | ....... 324/76.82 |
| 6,621,860 B1 * | 9/2003 | Yamaguchi et al. | .......... 324/620 |
| 6,687,629 B1 * | 2/2004 | Yamaguchi et al. | ............ 702/69 |
| 6,738,133 B1 | 5/2004 | Yin | |
| 7,317,309 B2 * | 1/2008 | Yamaguchi et al. | ....... 324/76.19 |
| 2003/0018442 A1 * | 1/2003 | Yamaguchi et al. | ............ 702/69 |
| 2005/0273320 A1 * | 12/2005 | Yamaguchi et al. | .......... 704/205 |
| 2007/0027658 A1 | 2/2007 | Pupalaikis et al. | |

FOREIGN PATENT DOCUMENTS

| | | |
|---|---|---|
| EP | 0140396 A1 | 5/1985 |
| EP | 0301254 A2 | 2/1989 |
| GB | 1271665 A | 4/1972 |
| WO | WO 00/39643 A1 | 7/2000 |
| WO | 2004/019018 A1 | 3/2004 |
| WO | 2005/121815 A1 | 12/2005 |

OTHER PUBLICATIONS

Balanis, "Antenna Theory Analysis and Design", New York, Wiley, pp. 288-306 and pp. 358-371, 1997.
Harris, "On the Use of Windows for Harmonic Analysis with the Discrete Fourier Transform", Proceedings of the IEEE, vol. 66, No. 1, pp. 51-83, Jan. 1978.

(Continued)

*Primary Examiner* — Jermele M Hollington
(74) *Attorney, Agent, or Firm* — Birch, Stewart, Kolasch & Birch, LLP.

(57) ABSTRACT

There is described a pulse analyzer (1) for sampling a pulse or a repetitive stream of pulses. The pulse analyzer multiplies a pulse by a set of basis functions (c1, c2) to generate a plurality of multiplied pulse functions, and a synthesizer (9a, 9b, 13) combines the multiplied pulse functions to generate a pulse sample. In particular, the synthesizer performs at least one integrating operation over an integration interval substantially corresponding to the duration of the pulse and at least one adding operation. The basis functions are such that the output of the synthesizer corresponds to a pulse sample for a sample time interval shorter than the integration interval.

19 Claims, 8 Drawing Sheets

(56) References Cited

OTHER PUBLICATIONS

Jin, "Advances in Particle Swarm Optimization for Antenna Designs: Real-Number, Binary, Single-Objective and Multiobejective Implementations", IEEE Transactions on Antennas and Propagation, vol. 55, No. 3, pp. 556-567, Mar. 2007.

Kahrs, "50 Years of RF and Microwave Sampling", IEEE Transactions on Microwave Theory and Techniques, vol. 51, No. 6, pp. 1787-1804, Jun. 2003.

Nuttall, "Some Windows with Very Good Sidelobe Behavior", IEEE Transactions on Acoustics, Speech, and Signal Processing, vol. ASSP-29, No. 1, pp. 84-91, Feb. 1981.

Yin, "Beam Diagnostics With Optical-Fiber Optics", Proceedings of 2005 Particle Accelerator Conference, Knoxville, Tennessee, pp. 3040-3042, May 2005.

Yin, "New Developments on Single-Shot Fiber Scope", Proceedings of European Particle Accelerator Conf. 2006, Edinburgh, Scotland, pp. 1253-1255, 2006.

* cited by examiner

PULSE ANALYZER

FIELD OF THE INVENTION

This invention relates to a method and apparatus for obtaining simultaneously discrete-time samples of both a wideband transient pulse and a quadrature signal associated with the pulse; the method being especially, but not exclusively, applicable to electronic systems, including oscilloscopes, capable of locating a pulse in time, determining two quadrature representations of the pulse, and extracting parameters characterizing the pulse shape.

BACKGROUND OF THE INVENTION

Suppose that a wideband pulse x(t) of finite duration and unknown shape is to be sampled at a plurality of J time instants $t_1, t_2, \ldots, t_j, \ldots t_J$. It is assumed that the pulse duration is limited by some maximum value T, and that the pulse time-of-arrival is approximately known. The acquired samples of the pulse x(t) are then used to determine some pulse descriptors such as shape and its moments, including location and time spread. The pulse under examination may be regarded as being observed at the output of a suitable sensor that has captured a portion of electromagnetic radiation scattered by a remote object of interest.

A review of the development of sampling techniques is given in "50 Years of RF and Microwave Sampling" by Mark Kahrs, IEEE Trans. Microwave Theory Tech., vol. 51, no. 1, pp. 1787-1804, June 2003.

Conventional sampling techniques utilise ultra-fast sampling circuits to produce instantaneous signal samples. However, such ultra-fast sampling circuits are generally expensive.

SUMMARY OF THE INVENTION

Aspects of the invention are set out in the accompanying claims.

The method according to the invention does not use 'time slices' of a pulse, but instead processes the whole pulse to obtain its 'instantaneous' values. Consequently, one of the distinct advantages of the invention follows from its potential capability of producing 'instantaneous' signal samples without actually using expensive ultra-fast sampling circuits. Each 'instantaneous' sample is obtained by suitably combining various averages determined over the duration T of the entire pulse x(t).

BRIEF DESCRIPTION OF THE DRAWINGS

Various embodiments of the invention will now be described with reference to the attached figures, in which.

DESCRIPTION OF THE INVENTION

Suppose that a wideband pulse x(t) of finite duration and unknown shape is to be sampled at a plurality of J time instants $t_1, t_2, \ldots, t_j, \ldots, t_J$. It is assumed that the pulse duration is limited by some maximum value T, and that the pulse time-of-arrival is approximately known. The acquired samples of the pulse x(t) are then used to determine some pulse descriptors such as shape and its moments, including location and time spread. The pulse under examination may be regarded as being observed at the output of a suitable sensor that has captured a portion of electromagnetic radiation scattered by a remote object of interest.

From the 'sifting' property of the Dirac delta function, or Dirac impulse, $\delta(t)$ it follows that a sample at time $t_j$ of a pulse x(t), i.e. the value $x(t_j)$, can be determined from the integral $$x(t_j) = \int_0^T x(t)\delta(t - t_j)dt$$

Figure 1:
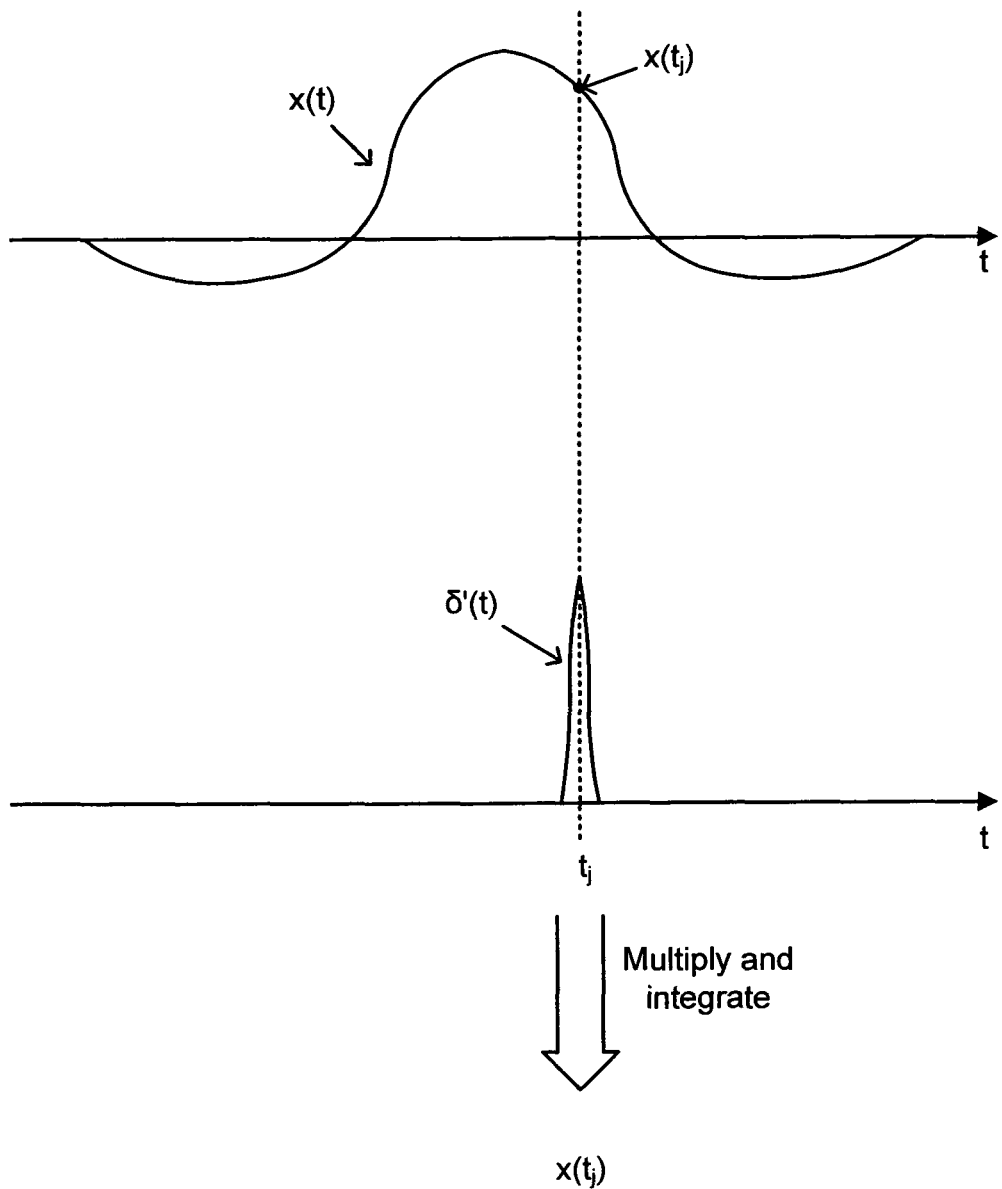
FIG. 1 depicts an example of a pulse x(t) being sampled at time $t_j$ with the use of a function approximating the Dirac impulse $\delta(t)$.

FIG. 1 depicts an example of a pulse x(t) being sampled at time $t_j$ with the use of a function $\delta'(t)$ approximating the Dirac impulse $\delta(t)$.

The Dirac delta function $\delta(t)$ can be approximated by a central segment of a sampling function of the form $$D_K(t) = a_0 + \sum_{k=1}^{K} a_k \cos 2\pi f_k t$$

where $$\{a_0, a_1, a_2, \ldots, a_k, \ldots, a_K\}$$

is a set of predetermined (K+1) coefficients, and $$\{f_1, f_2, \ldots, f_k, \ldots, f_K\}$$

is a corresponding set of predetermined K frequencies.

It is convenient, although not necessary, to utilize frequencies $f_k$ that are successive harmonics of some suitably chosen basic frequency $f_B$, i.e.

$$f_k = k f_B, k = 1, 2, \ldots, K$$

Figure 2:
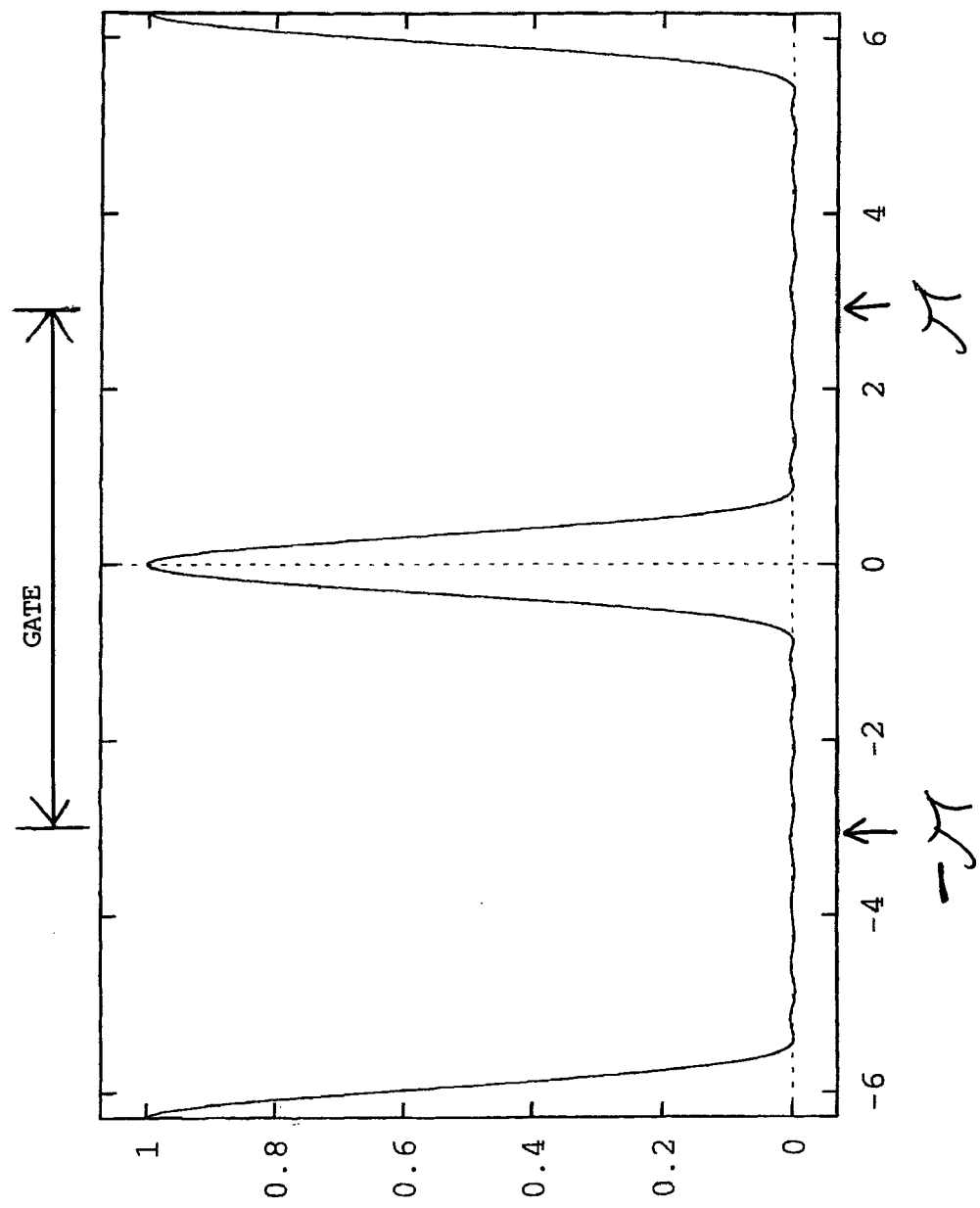
FIG. 2 shows the shape of a periodic sampling function $D_8(t)$ obtained by combining a constant and eight consecutive harmonics.

For illustrative purposes, FIG. 2 shows the shape of a periodic sampling function $D_8(t)$ obtained by combining a constant and eight consecutive harmonics, where $D_8(t) = 0.117 + 0.226 \cos t + 0.201 \cos 2t + 0.164 \cos 3t + 0.123 \cos 4t + 0.083 \cos 5t + 0.050 \cos 6t + 0.025 \cos 7t + 0.010 \cos 8t$ The above sampling function approximates the Dirac delta function $\delta(t)$ within the time interval $(-\pi, \pi)$ equal to the period of the lowest used frequency, $1/(2\pi)$. In order to retain just one peak, the sampling function is multiplied by a unit-amplitude time gate g(t), spanning the time interval $(-\pi, \pi)$.

In the above design, the peak width, i.e. the parameter FWHH (full width at half height) is equal to 90 percent of the period of the highest frequency used; the magnitude of the sidelobe level is kept below 0.0037 (i.e. −48.6 dB).

In general, the required peak width (FWHH) will depend on time (or range) resolution of the sensing system. For example, if the time resolution is equal to 1 ns (equivalent to range resolution of 0.15 m), then the peak width of $D_K(t)$ should not exceed 1 ns; consequently, in a design similar to the illustrative example above, the highest frequency $f_K$ should not be less than 900 MHz.

For correct operation, the period of the lowest used frequency $f_1$ should, at least, be equal to the pulse duration T. For example, if the expected pulse duration is T=30 ns, then the lowest frequency $f_1$ should not exceed 33 MHz.

In accordance with a first aspect of the invention, a sample at time $t_j$ of pulse x(t), i.e. the value $x(t_j)$, is determined by implementing Procedure 1:
1. selecting a first frequency $f_k$ from a set of K predetermined frequencies $$f_1, f_2, \ldots, f_k, \ldots, f_K$$

and generating a harmonic co-sinusoidal signal of the form $$c_k(t_j) = \cos(2\pi f_k t - \theta_{jk})$$

where $\theta_{jk} = 2\pi f_k t_j$ is the initial phase;
2. multiplying the pulse x(t) by a gated version of the harmonic signal $c_k(t_j)$ and integrating the resulting product to obtain a value $C_k(t_j)$;
3. repeating steps 1 and 2 until each of the K frequencies has been utilized, such a repetitive operation resulting in a set of K values;

$$C_1(t_j), C_2(t_j), \ldots, C_k(t_j), \ldots, C_K(t_j)$$

4. integrating the pulse x(t) to obtain a constant value $C_0$ (this step is not needed, if the pulse x(t) has no DC (direct-current) component);
5. utilizing such obtained values to form their linear combination as follows $$a_0 C_0 + a_1 C_1(t_j) + a_2 C_2(t_j) + \ldots + a_k C_k(t_j) + \ldots + a_K C_K(t_j)$$

where $\{a_0, a_1, a_2, \ldots, a_k, \ldots, a_K\}$ is a set of (K+1) predetermined coefficients; and
6. using the above combination as an estimate of the sample $x(t_j)$ of the pulse x(t) being analyzed.

Figure 3:
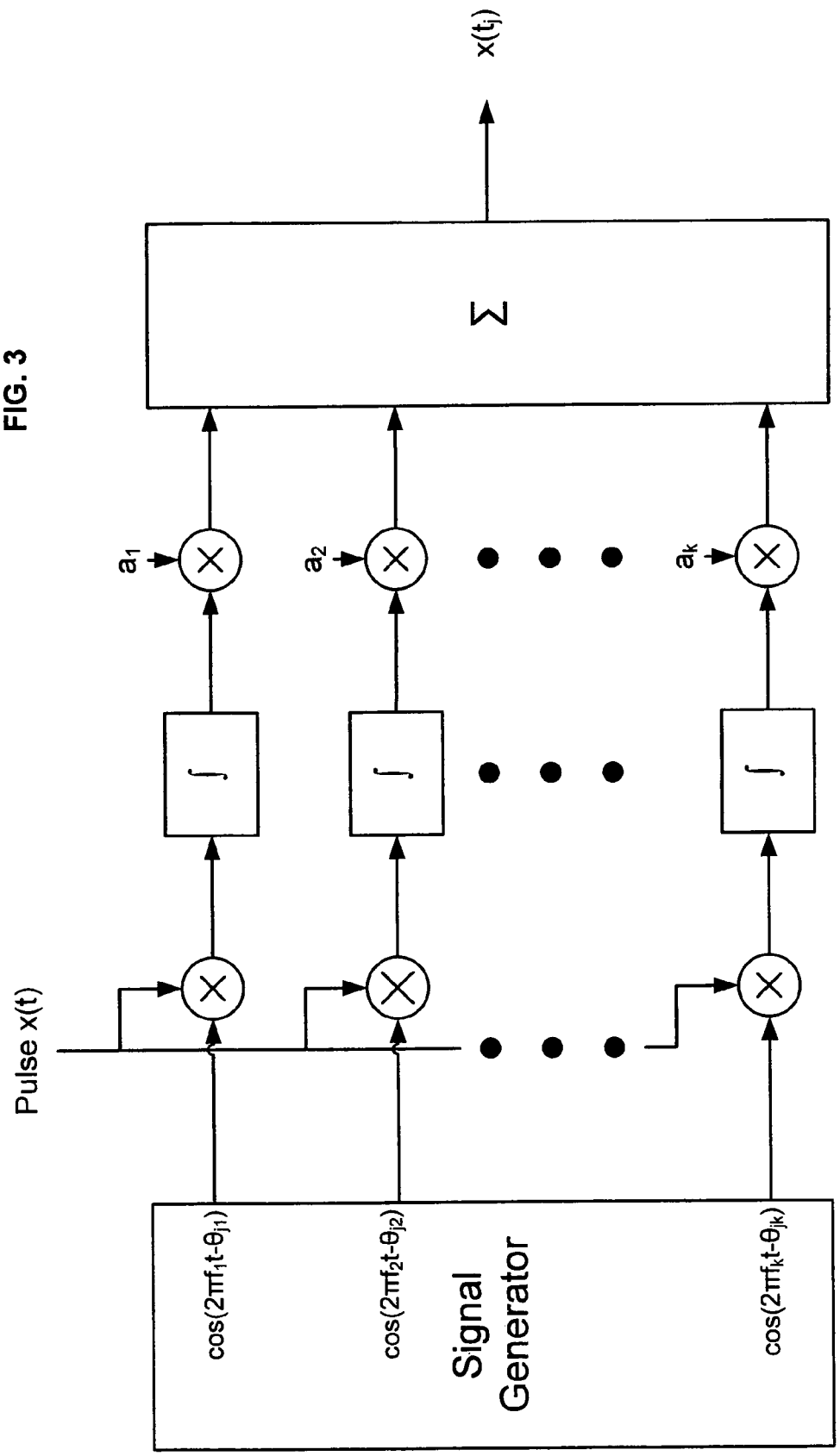
FIG. 3 depicts schematically the operations to be performed to obtain a single sample $x(t_j)$ of a pulse x(t)

FIG. 3 depicts schematically the operations to be performed in order to obtain a single sample $x(t_j)$ of a pulse x(t) under examination.

Obviously, to obtain a suitable representation $$\{x(t_1), x(t_2), \ldots, x(t_j), \ldots, x(t_J)\}$$

of a pulse x(t) being analyzed, Procedure 1 will have to be repeated for each of J time instants $t_j$, j=1, 2, . . . , J.

In contrast to conventional sampling, the disclosed method does not use 'time slices' of a pulse, but it processes the whole pulse to obtain its 'instantaneous' values. Consequently, one of the distinct advantages of the disclosed method follows from its potential capability of producing 'instantaneous' signal samples without actually using expensive ultra-fast sampling circuits. Each 'instantaneous' sample is obtained by suitably combining various averages determined over the duration T of the entire pulse x(t).

From the description of the disclosed method it follows that to obtain an accurate representation of a pulse x(t) under examination, the sampling function $D_K(t)$ should be an adequate approximation of the Dirac delta function δ(t) over the entire interval T of pulse duration.

Various solutions to the above approximation problem are known to those skilled in the art, as problems of similar nature arise in spectral analysis and in the design of antenna arrays. A fairly comprehensive review of the available solutions can be obtained, for example, by studying the following publications:
1. F. J. Harris: "On the Use of Windows for Harmonic Analysis with the Discrete Fourier Transform," *Proc. IEEE*, vol. 66, pp. 51-83, January 1978.
2. A. H. Nuttall: "Some Windows with Very Good Sidelobe Behaviour," IEEE Trans. Acoust. Speech Signal Processing, vol. ASSP-29, no. 1, pp. 84-91, February 1981.
3. C. A. Balanis, *Antenna Theory*. New York: Wiley, 1997.
4. N. Jin and Y. Rahmat-Samii: "Advances in Particle Swarm Optimization for Antenna Design," *IEEE Trans. Antennas Propag.*, vol. 55, no. 3, pp. 556-567, March 2007.

As known to those skilled in the art, a complete characterization of a wideband transient pulse x(t) can only be obtained by determining additionally the so-called quadrature signal y(t) associated with the underlying pulse x(t). In principle, a quadrature signal can be produced by a Hilbert transformer that convolves an input pulse with kernel $\gamma(t)=1/(\pi t)$; such an operation is usually performed digitally by suitable processing of discrete-time samples of the input pulse.

If the quadrature signal y(t) is available, then the pulse x(t) of interest can be characterized by its (Hilbert) envelope z(t) and phase function φ(t), defined by $$z(t) \triangleq \sqrt{x^2(t) + y^2(t)}$$

$$\phi(t) \triangleq \tan^{-1}[y(t)/x(t)]$$

where $\tan^{-1}(\cdot)$ is a four-quadrant function. The envelope z(t) may then be used to determine the pulse position in time by estimating some location parameters, such as the mean value ('centre of gravity'), median or the 'dominating' mode.

For example, the mean location ('centre of gravity') of a pulse is calculated from $$\bar{t} = \int t z^2(t) dt / \int z^2(t) dt$$

It should be noted that the above formula uses the squared envelope $z^2(t)$, sometimes referred to as 'power' distribution.

The median location $t_M$ of a pulse is defined as $$\int_0^{t_M} z^2(t) dt = \frac{1}{2} \int_0^\infty z^2(t) dt$$

Hence, the median location $t_M$ is a time instant so selected within the pulse duration as to obtain equal energy in the left and the right portions of the pulse x(t).

The mode location $t_P$ of a pulse is defined as the time instant at which the power $z^2(t)$ of the pulse x(t) reaches its maximum value, hence $$t_P = \max_t \{z^2(t)\}$$

From the above discussion it follows that the knowledge of the wideband pulse x(t) itself together with supplementary information provided by its associated quadrature signal y(t) allows determination of the pulse location.

When the pulse location in time has been determined, it may be advantageous to assign the total energy $\int z^2(t) dt$ of that pulse to this particular location. Such an operation may be viewed as pulse condensation or pulse compaction.

In some applications, it may be of interest to determine higher moments of the pulse power distribution $z^2(t)$ by using the methods known to those skilled in the art. In particular, the second central moment will characterize the pulse spread in time, whereas the third central moment will provide information regarding the pulse 'skewness'.

When x(t) is a pulse scattered by a complex object of interest, the envelope z(t) itself, or the power distribution in time $z^2(t)$, will supply some information about the object's structure. In some cases, also the phase function $\phi(t)$ will be used to provide complementary information.

In a way similar to sampling with the Dirac impulse, a sample at time $t_i$ of the quadrature signal y(t) associated with the underlying pulse x(t), i.e. the value $y(t_i)$, can be determined from the integral $$y(t_i) = \int_0^T x(t)\gamma(t - t_i)dt$$

where $\gamma(t)=1/(\pi t)$ is a Hilbert transform of the Dirac impulse $\delta(t)$. (Because of the singularity of $\gamma(t)$, the principal value of the above integral must be used.)

Figure 4:
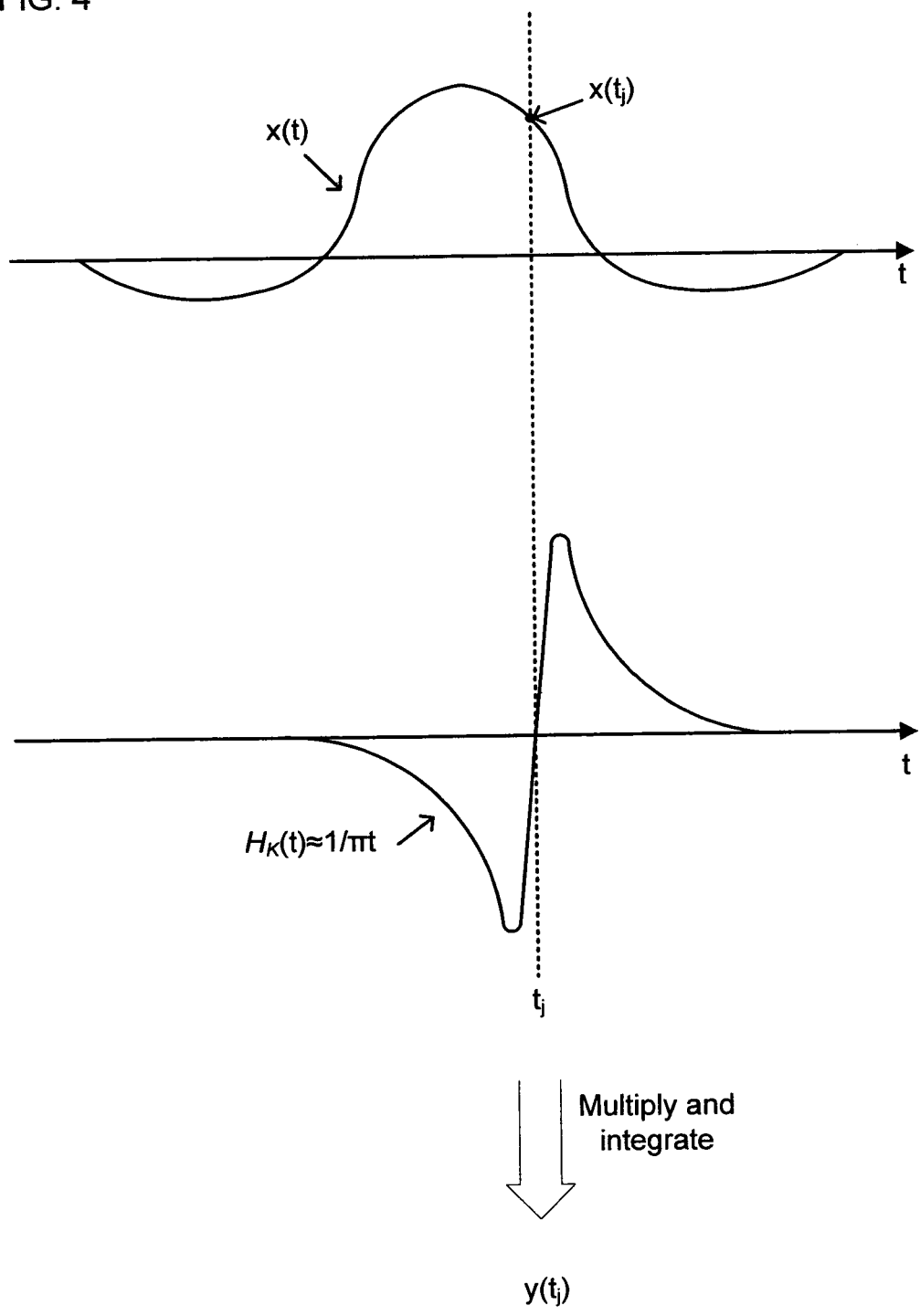
FIG. 4 is an example of a pulse x(t) being sampled at time $t_j$ with the use of a function approximating the kernel $\gamma(t)=1/(\pi t)$.

FIG. 4 is an example of a pulse x(t) being sampled at time $t_i$ with the use of a function $H_K(t)$ approximating the kernel $\gamma(t)=1/(\pi t)$. It should be noted that such sampling of the pulse x(t) produces in fact samples of the associated quadrature signal y(t).

In accordance with another aspect of the invention, kernel $\gamma(t)=1/(\pi t)$ is approximated by a central segment of a quadrature sampling function of the form $$H_K(t) = \sum_{k=1}^{K} a_k \sin 2\pi f_k t$$

where both the sets of predetermined K coefficients and frequencies, $\{a_1, a_2, a_k, \ldots, a_K\}$ and $\{f_1, f_2, \ldots, f_k, \ldots, f_K\}$, have the same elements as the corresponding sets used for constructing a sampling function $D_K(t)$.

Figure 5:
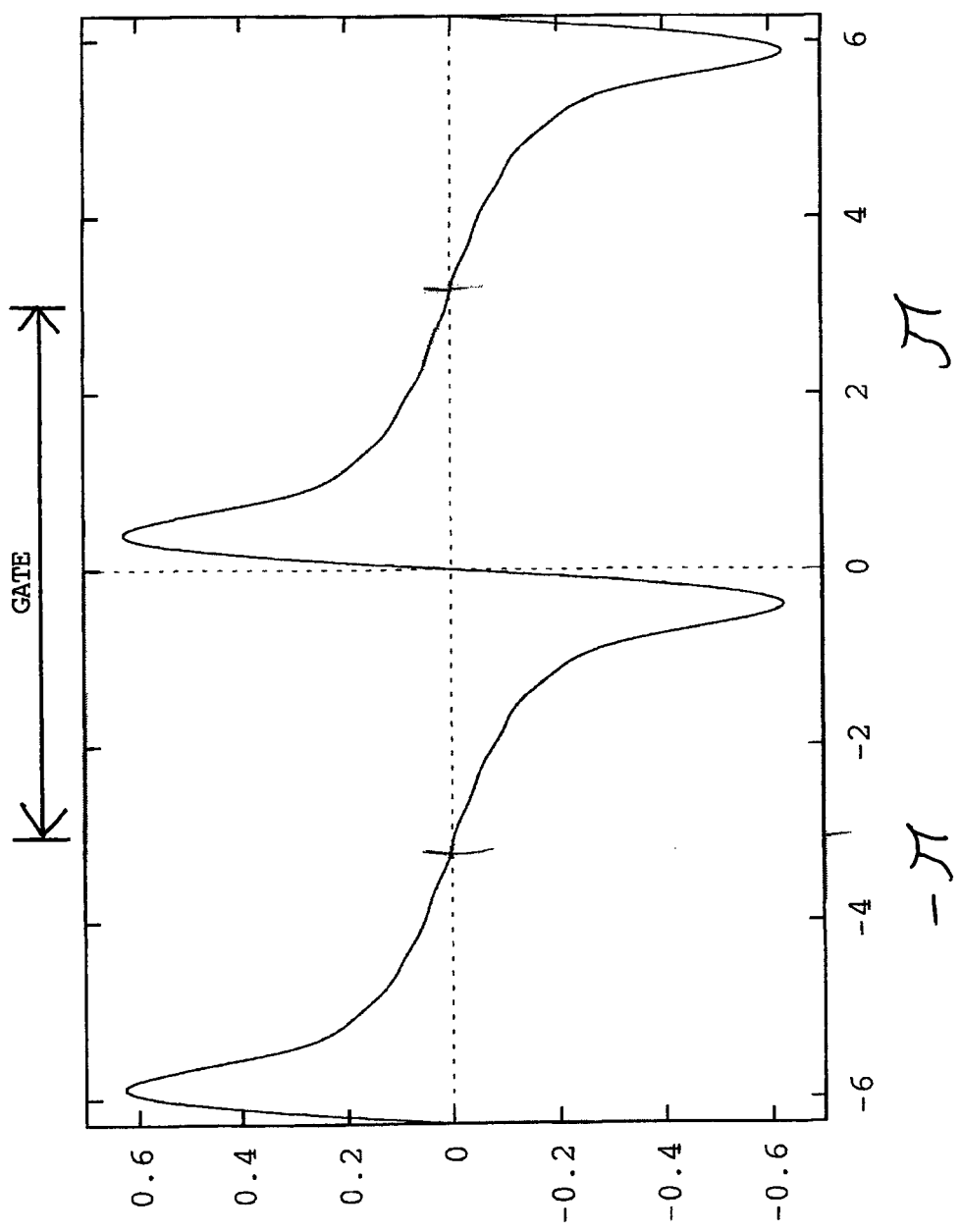
FIG. 5 shows the shape of a quadrature sampling function $H_8(t)$ obtained by combining eight consecutive harmonics.

For illustrative purposes, FIG. 5 shows the shape of a quadrature sampling function $H_8(t)$ obtained by combining eight consecutive harmonics, where $H_8(t)=0.226 \sin t+0.201 \sin 2t+0.164 \sin 3t+0.123 \sin 4t++0.083 \sin 5t+0.050 \sin 6t+0.025 \sin 7t+0.010 \sin 8t$ It should be noted that the above quadrature sampling function $H_8(t)$ is a Hilbert transform of the sampling function $D_8(t)$, depicted in FIG. 2.

The quadrature sampling function approximates the kernel $\gamma(t)$ within the time interval $(-\pi, \pi)$ equal to the period of the lowest used frequency, $1/(2\pi)$. In order to select the correct segment of the function, the sampling function is multiplied by a unit-amplitude time gate g(t), spanning the time interval $(-\pi, \pi)$.

In accordance with a further aspect of the invention, a sample at time $t_i$ of the quadrature signal y(t) associated with pulse x(t), i.e. the value $y(t_i)$, is determined by implementing Procedure 2:

1. selecting a first frequency $f_k$ from a set of K predetermined frequencies $f_1, f_2, \ldots, f_k, \ldots, f_K$ and generating a harmonic sinusoidal signal of the form $s_k(t_i)=\sin(2\pi f_k t-\theta_{ik})$ where $\theta_{ik}=2\pi f_k t_i$ is the initial phase;

2. multiplying the pulse x(t) by a gated version of the harmonic signal $s_k(t_i)$ and integrating the resulting product to obtain a value $S_k(t_i)$;
3. repeating steps 1 and 2 until each of the K frequencies has been utilized; such a repetitive operation will result in a set of K values $S_1(t_i), S_2(t_i), \ldots, S_k(t_i), \ldots, S_K(t_i)$ 4. utilizing such obtained values to form their linear combination as follows $a_1 S_1(t_i)+a_2 S_2(t_i)+\ldots+a_k S_k(t_i)+\ldots+a_K S_K(t_i)$ where $\{a_1, a_2, \ldots, a_k, \ldots a_K\}$ is a set of K predetermined coefficients; and
5. using the above combination as an estimate of the sample $y(t_i)$ of the quadrature signal y(t) associated with the pulse x(t) under examination.

Obviously, in order to obtain a suitable representation $\{y(t_1), y(t_2), \ldots, y(t_i), \ldots, y(t_I)\}$ of the quadrature signal y(t) associated with pulse x(t), Procedure 2 will have to be repeated for each of I time instants $t_i$, where i=1, 2, ..., I.

A further distinct advantage of the disclosed aspects of the invention follows from its potential ability to produce 'instantaneous' samples of the quadrature signal y(t) by sampling in fact an underlying pulse x(t). Those samples are determined without the use of expensive ultra-fast sampling circuits and complicated digital signal processing. Each 'instantaneous' sample of the quadrature signal is obtained by suitably combining various averages determined over the entire duration T of the underlying pulse x(t).

Although Procedure 1 and Procedure 2 have similar structures, the ranges of the corresponding time indices, $\{1, 2, \ldots, j, \ldots, J\}$ and $\{1, 2, \ldots, i, \ldots, I\}$, are very different. This discrepancy follows from different shapes of the sampling function $D_K(t)$ and the quadrature sampling function $H_K(t)$. The sampling function $D_K(t)$ approximates an impulse and, therefore, is concentrated within a short time interval, whereas the time extent of the quadrature sampling function $H_K(t)$ is intentionally large (compare FIG. 22 and FIG. 25). Those dramatically different time scales of the sampling functions $D_K(t)$ and $H_K(t)$ make concurrent running of Procedures 1 and 2 a very difficult task indeed. However, it would be advantageous to perform sampling of an underlying pulse and an associated quadrature signal at the same time instants. Therefore, for this purpose some other two sampling functions need to be devised.

Figure 6:
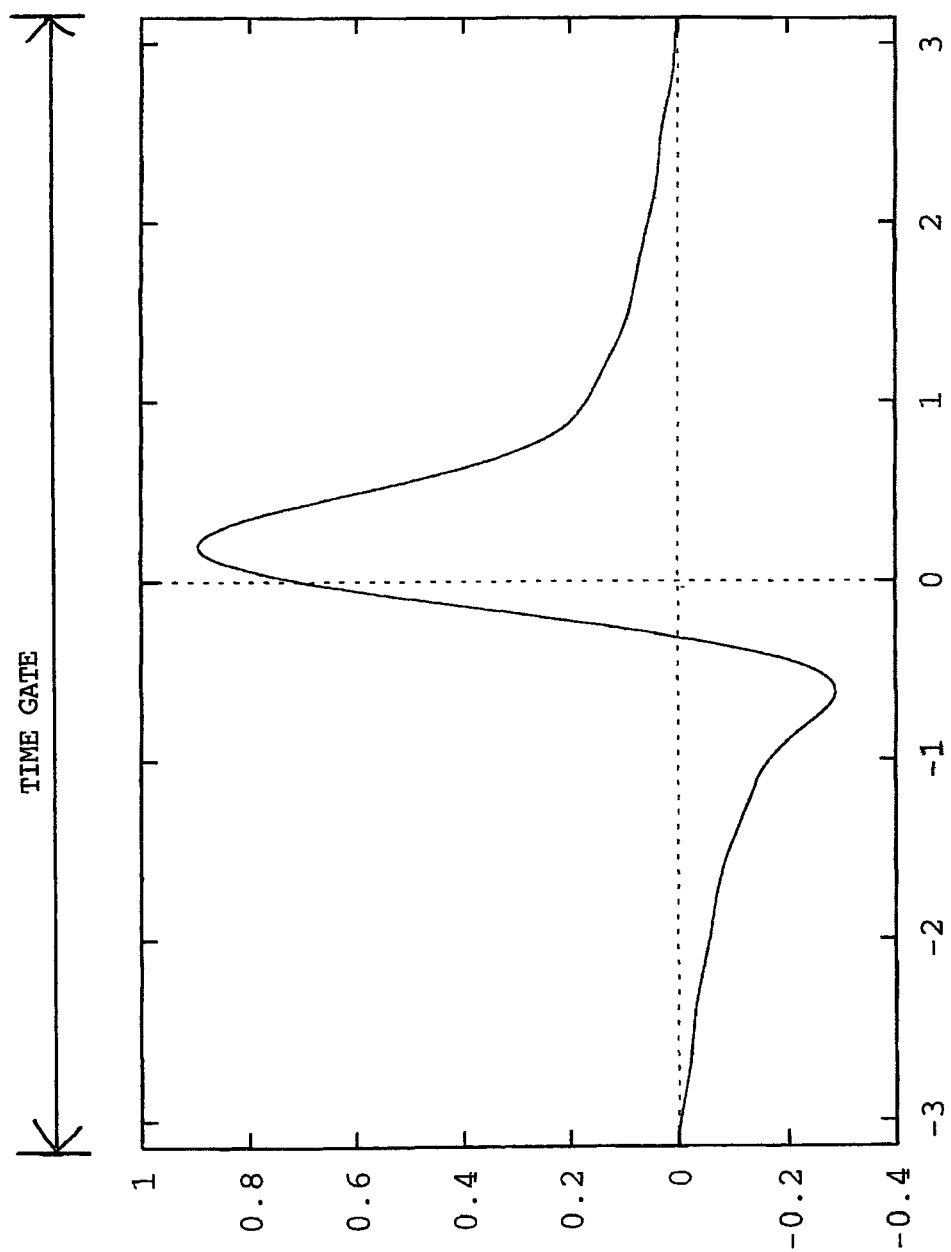
FIG. 6 depicts a first new sampling function $A_8(t)$ constructed in accordance with the invention.
Figure 7:
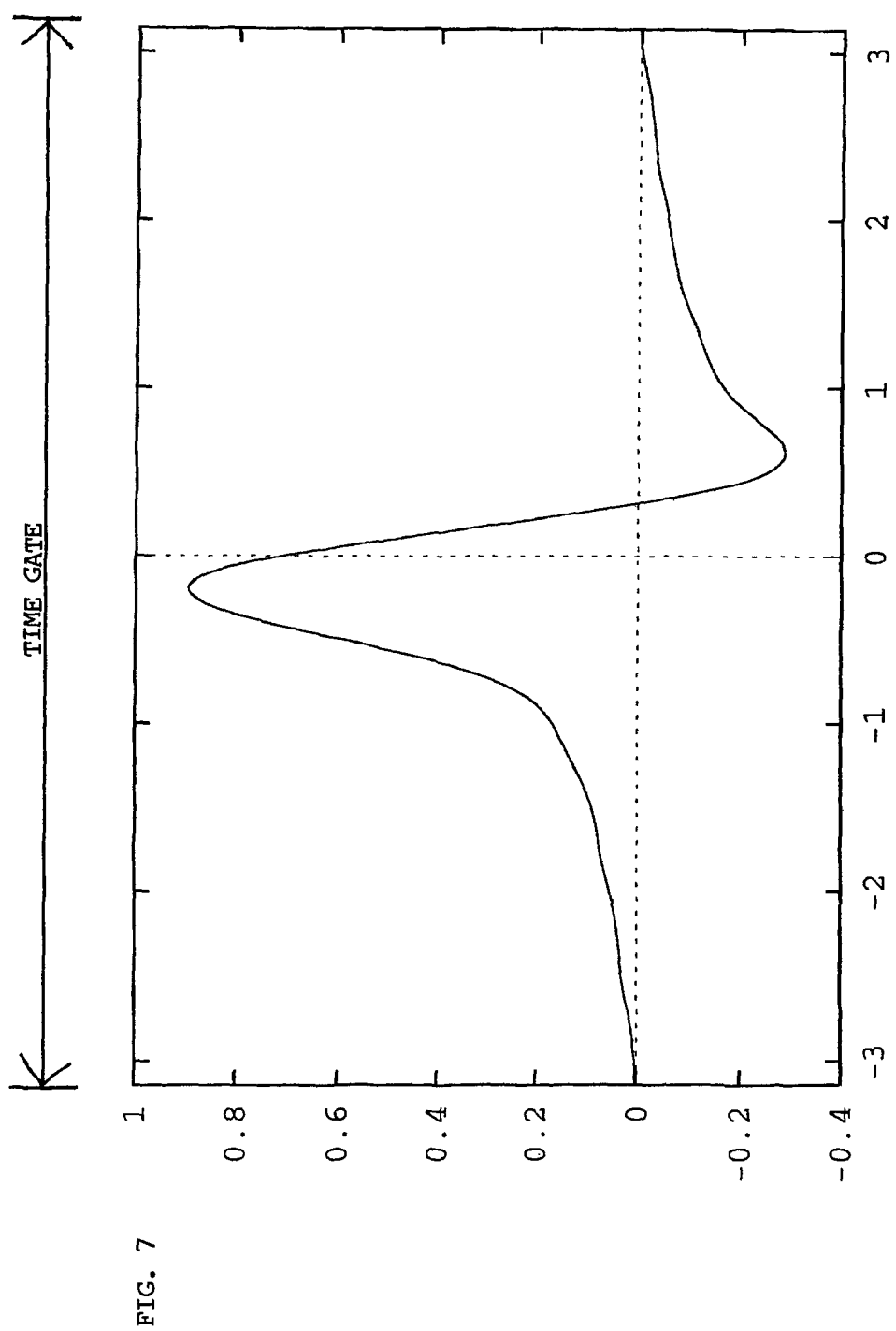
FIG. 7 depicts a second new sampling function $B_8(t)$ constructed in accordance with the invention.

In accordance with a further aspect of the invention, the sampling functions $D_K(t)$ and $H_K(t)$ are used to construct two new sampling functions, $A_K(t)$ and $B_K(t)$, defined as follows $A_K(t)=[D_K(t)+H_K(t)]/\sqrt{2}$ $B_K(t)=[D_K(t)-H_K(t)]/\sqrt{2}$ FIG. 6 and FIG. 7 depict two new sampling functions, $A_8(t)$ and $B_8(t)$, obtained from previously considered functions $D_8(t)$ and $H_8(t)$ and multiplied by a suitable unit-amplitude time gate. As seen, the two shapes are mirror images of one another and are, therefore, of the same time scale.

The disclosed construction results in the following forms of the two new sampling functions $A_K(t)$ and $B_K(t)$ $$A_K(t) = \frac{a_0}{\sqrt{2}} + \sum_{k=1}^{K} a_k \cos(2\pi f_k t - \pi/4)$$

and $$B_K(t) = \frac{a_0}{\sqrt{2}} + \sum_{k=1}^{K} a_k \cos(2\pi f_k t + \pi/4)$$

The new sampling functions, $A_K(t)$ and $B_K(t)$, may be viewed as a result of rotation by $\pi/4$ of the original sampling functions $D_K(t)$ and $H_K(t)$.

In accordance with yet another aspect of the invention, the two new sampling functions, $A_K(t)$ and $B_K(t)$, are used to sample an underlying pulse $x(t)$ to obtain samples of its two images (representations), $u(t)$ and $v(t)$. Those images, being in quadrature to one another, will preserve the shape of the envelope $z(t)$ of the pulse $x(t)$, i.e., $$z(t) = \sqrt{x^2(t)+y^2(t)} = \sqrt{u^2(t)+v^2(t)}$$

Consequently, all descriptors of the original pulse $x(t)$, including shape and mean location, can be determined in the usual manner.

Furthermore, the new phase function $\psi(t)$ $$\psi(t) = \tan^{-1}[v(t)/u(t)]$$

will be a replica of the original phase function $\phi(t)$ shifted by a constant $\pi/4$. Sample at time $t_j$ of two representations, $u(t)$ and $v(t)$, of the underlying pulse $x(t)$, i.e. the values $u(t_j)$ and $u(t_j)$, are determined by implementing Procedure 3:

1. selecting a first frequency $f_k$ from a set of K predetermined frequencies $$f_1, f_2, \ldots, f_k, \ldots, f_K$$

and generating two harmonic co-sinusoidal signal of the form $$c_1 k(t_j) = \cos(2\pi f_k t - \theta_{jk} - \pi/4)$$

$$c_2 k(t_j) = \cos(2\pi f_k t - \theta_{jk} + \pi/4)$$

where $\theta_{jk} = 2\pi f_k t_j$ is the initial phase;
2. multiplying the pulse $x(t)$ by gated versions of the two harmonic signals, $c_{1k}(t_j)$ and $c_{2k}(t_j)$, and integrating the resulting products to obtain two values: $U_k(t_j)$ and $V_k(t_j)$;
3. repeating steps 1 and 2 until each of the K frequencies has been utilized; such a repetitive operation will result in a set of (2K) values $$U_1(t_j), U_2(t_j), \ldots, U_k(t_j), \ldots, U_K(t_j)$$

$$V_1(t_j), V_2(t_j), \ldots, V_k(t_j), \ldots, V_K(t_j)$$

4. integrating the pulse $x(t)$ to obtain a constant value $C_0$ (this step is not needed, if the pulse $x(t)$ has no DC (direct-current) component);
5. forming two linear combinations as follows $$a_0 C_0/\sqrt{2} + a_1 U_1(t_j) + a_2 U_2(t_j) + \ldots + a_k U_k(t_j) + \ldots + a_K U_K(t_j)$$

$$a_0 C_0/\sqrt{2} + a_1 V_1(t_j) + a_2 V_2(t_j) + \ldots + a_k V_k(t_j) + \ldots + a_K V_K(t_j)$$

where $\{a_0, a_1, a_2, \ldots, a_k, \ldots, a_K\}$ is a set of (K+1) predetermined coefficients; and
6. using the above combinations as respective estimates of the samples $u(t_j)$ and $v(t_j)$ of the two representations $u(t)$ and $v(t)$ of the pulse $x(t)$ being analyzed.

Obviously, in order to obtain suitable representations $$\{u(t_1), u(t_2), \ldots, u(t_j), \ldots, u(t_J)\}$$

$$\{v(t_1), v(t_2), \ldots, v(t_j), \ldots, v(t_J)\}$$

of the two 'images', $u(t)$ and $v(t)$, of the underlying pulse $x(t)$, Procedure 3 will have to be repeated for each of J time instants $t_j$, where $j=1, 2, \ldots, J$.

Figure 8:
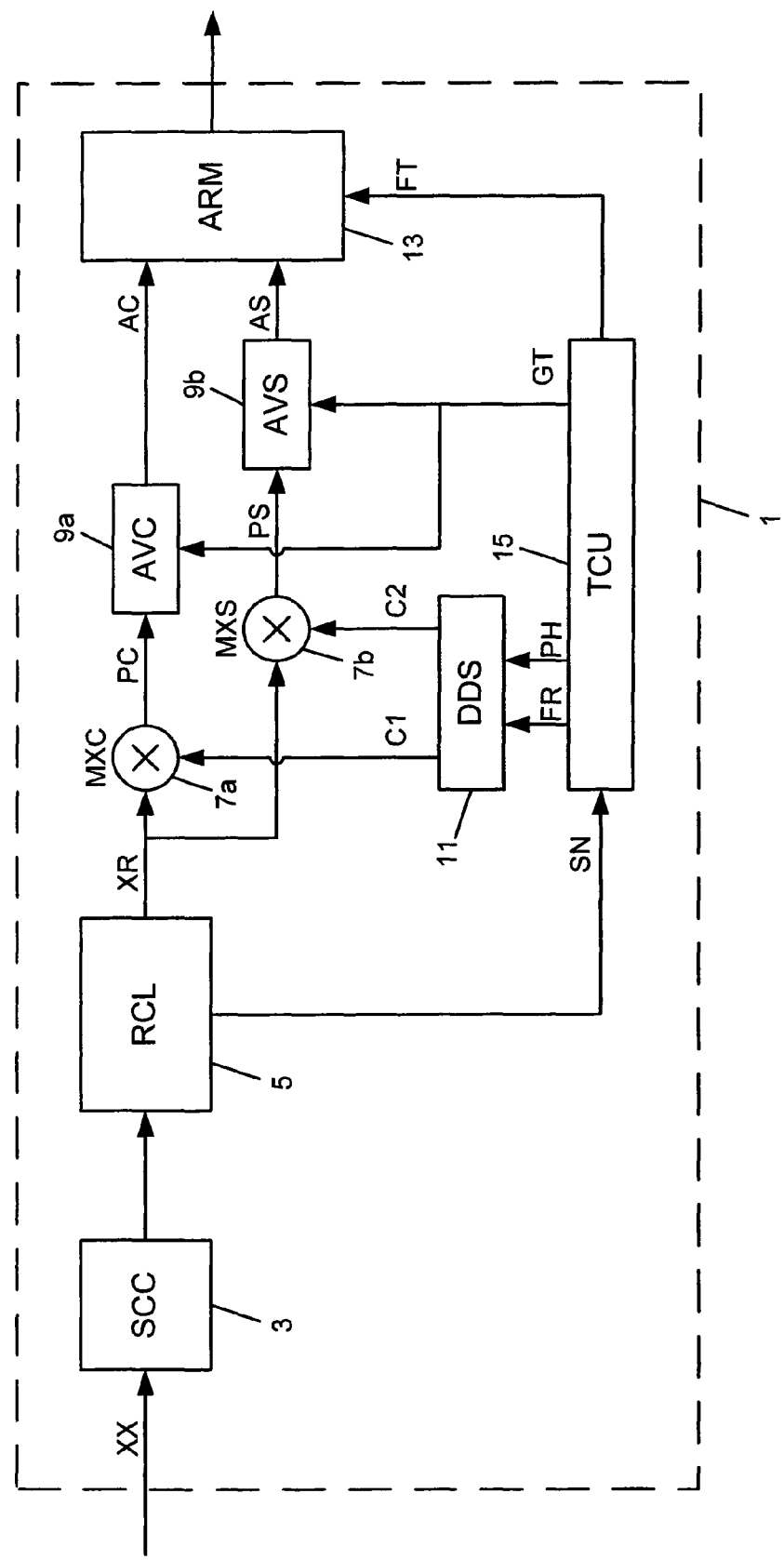
FIG. 8 is a functional block diagram of a pulse analyzer PAN constructed in accordance with the invention.

FIG. 8 is a functional block diagram of a pulse analyzer (PAN) 1 constructed in accordance with the invention. The analyzer PAN implements Procedure 3 disclosed above.

The system comprises a signal conditioning circuit (SCC) 3, an optical-fibre recirculating loop (RCL) 5, a first (MXC) 7a, a second mixer (MXS) 7b, a first integrator (AVC) 9a, a second integrator (AVS) 9b, a direct digital synthesizer (DDS) 11, an arithmetic unit (ARM) 13, and a timing/control unit (TCU) 15.

The signal conditioning circuit 3 captures a single pulse $x(t)$ that appears transiently at input XX and sends the pulse to the recirculating loop 5 that regenerates this pulse to produce, at output XR, a pulse train comprising a plurality of replicas of the pulse $x(t)$. The recirculating loop 5 also produces a synchronizing signal SN, preceding each of the pulse replicas.

Each of the identical pulses constituting the pulse train is applied in parallel to the two mixers (multipliers) 7a and 7b. The other mixer inputs are driven by respective co-sinusoidal signals, C1 and C2, supplied by the direct digital synthesizer 11: mixer 7a receives signal C1 of the form $$c_1 k(t_j) = \cos(2\pi f_k t - \theta_{jk} - \pi/4)$$

whereas mixer 7b is driven by signal C2

$$c_2 k(t_j) = \cos(2\pi f_k t - \theta_{jk} + \pi/4)$$

In the above formulae, $f_k$ is a frequency selected from a set of K predetermined frequencies, $f_1, f_2, \ldots, f_k, \ldots, f_K$, and the initial phase is determined from $$\theta_{jk} = 2\pi f_k t_j$$

where $t_j$ is a time instant at which a sample is taken.

The output signals supplied by the mixers 7a and 7b, are respectively applied to the two gated integrators 9a and 9b via their respective inputs, PC and PS. The integrators 9 perform integration of their input signals, PC and PS, during a time interval determined by a time gate GT supplied by the timing/control unit 15. The values, AC and AS, produced by the integrators 9 are then sent to the arithmetic unit 13.

The arithmetic unit 13 utilizes input values, AC and AS, produced for each of K predetermined frequencies, $f_1, f_2, \ldots, f_k, \ldots, f_K$, and for each of J predetermined time instants, $t_1, t_2, \ldots, t_j, \ldots, t_J$, to determine the pulse shape, its envelope $z(t)$ and phase function $\psi(t)$ and, if required, other parameters of interest, such as mean time location, time spread etc. For correct identification of the actual frequency $f_k$ and time instant $t_j$, the arithmetic unit 13 receives, from the timing/control unit 15 via input FT, a frequency index f and the time index j.

The direct digital synthesizer 11 produces two signals, C1 and C2, required by the mixers 7a and 7b in response to two control signals, FR and PH, used by the synthesizer 11 to set the correct frequency, $f_k$, and phase $\theta_{jk}$.

In general, the recirculating loop 5 has to produce (J·K) identical replicas of the input transient pulse $x(t)$. For example, if the number K of used frequencies is 32 and the number J of time instants is also 32, the loop 5 has to supply 1032 replicas. This is a realistic requirement; for example, a system described in: Yan Yin, *Beam Diagnostics with Optical-Fibre Optics*. Proc. 2005 Particle Accelerator Conf., Knoxville, pp. 3040-30-42, May 2005, is capable of producing 3000 replicas with a 2-km long optical-fibre loop. See also:

Ming-Chiang Li, *RF Signal Train Generator and Interferoceivers*.

U.S. Pat. No. RE37,561, 26 Feb. 2002.

Yan Yin, *Method and Device for Measuring Single-Shot Transient Signals*.

U.S. Pat. No. 6,738,133, 18 May 2004.

Yan Yin and Xiuge Che, *New Developments on Single-Shot Fibre Scope*. Proc. 2006 European Particle Accelerator Conf., Edinburgh, pp. 1253-1255, 2006.

Instead of using a recirculating loop, a single pulse could be split and input into multiple parallel channels for processing.

The foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated.

The invention claimed is:

1. A pulse analyser for sampling a pulse or a repetitive stream of pulses, the pulse analyser comprising:
   a multiplier that multiplies a pulse by a set of basis functions to generate a plurality of multiplied pulse functions; and
   a synthesiser configured to combine the multiplied pulse functions by performing at least one integrating operation over an integration interval substantially corresponding to the duration of the pulse and at least one adding operation to generate a pulse sample,
   where the pulse sample has a sample time interval shorter than the integration interval.

2. A pulse analyser according to claim 1, wherein the basis functions are selected so that the pulse analyser, in effect, multiplies the pulse or repetitive stream of pulses by an approximation of a delta function at a timing in the centre of the sample time interval.

3. A pulse analyser according to claim 2, wherein the delta function is an analytic delta function.

4. A pulse analyser according to claim 2, wherein the delta function has components corresponding to an approximation of a Dirac delta function and an approximation of a Hilbert transform of the Dirac delta function.

5. A pulse analyser according to claim 2, wherein the delta function has two components, each component corresponding to a respective different combination of an approximation of a Dirac delta function and an approximation of a Hilbert transform of the Dirac delta function.

6. A pulse analyser according to claim 5, wherein the two components form a mirrored pair of sampling functions.

7. A pulse analyser according to claim 1, wherein the basis functions are selected so that the pulse analyser, in effect, multiplies the pulse or repetitive stream of pulses by an approximation of the Hilbert transform of a delta function centred in the sample time interval.

8. A pulse analyser according to claim 1, wherein the synthesiser is configured to integrate each of the multiplied pulse functions over the integration interval to generate a plurality of integration values, and to perform an adding operation on the integration values.

9. A pulse analyser according to claim 8, wherein said adding operation comprises a weighted addition.

10. A pulse analyser according to claim 1, further comprising a signal conditioner configured to capture a single pulse and to generate a repetitive stream of pulses in which each pulse is a replica of the captured pulse.

11. A pulse analyser according to claim 10, wherein the signal conditioner comprises a recirculating loop having an input for receiving a captured pulse and an output for outputting said repetitive stream of pulses.

12. A pulse analyser according to claim 11, wherein said input converts an electrical pulse into a corresponding optical pulse, said recirculating loop comprises a loop of optical fiber and an amplifier, and the output comprise a convertor for converting part of the optical signal circulating in the optical fibre loop into a corresponding electrical signal.

13. A pulse analyser according to claim 1, wherein the basis functions are oscillating signals at respective different frequencies.

14. A pulse analyser according to claim 1, wherein the pulse analyser samples the pulse or repetitive stream of pulses at a plurality of different timings to generate an envelope function for the pulse.

15. A pulse analyser according to claim 14, wherein the pulse analyser determines a property of the pulse from the pulse envelope.

16. A pulse analyser according to claim 15, wherein the pulse analyser determines a timing for the pulse based on said envelope function.

17. A pulse analyser according to claim 16, wherein pulse analyser determines the time by calculating at least one of the mean timing, the median timing and the mode timing for the pulse based on said envelope function.

18. A method of analysing a pulse, the method comprising:
   applying an analysis function to the pulse by deriving a sample value for each of plural time instants within the duration of the pulse, each sample value being derived by combining the pulse with each of a plurality of spectral components of a version of the analysis function for the respective time instant; and
   deriving a combination of the results by performing an integrating operation over an integration interval substantially corresponding to the duration of the pulse and at least one adding operation.

19. A method as claimed in claim 18, comprising applying first and second analysis functions to the pulse, the first and second functions being orthogonal or having orthogonal components.

* * * * *